United States Patent
Bohnert et al.

(10) Patent No.: US 11,143,678 B2
(45) Date of Patent: Oct. 12, 2021

(54) POLARIZATION OPTICAL DETECTION WITH ENHANCED ACCURACY IN THE HIGH-SIGNAL REGIME

(71) Applicant: ABB POWER GRIDS SWITZERLAND AG, Baden (CH)

(72) Inventors: Klaus Bohnert, Oberrohrdorf (CH); Andreas Frank, Zürich (CH); Georg Muller, Glattpark/Opfikon (CH); Lin Yang, Steinhausen (CH)

(73) Assignee: ABB POWER GRIDS SWITZERLAND AG, Baden (CH)

( * ) Notice: Subject to any disclaimer, the term of this patent is extended or adjusted under 35 U.S.C. 154(b) by 0 days.

(21) Appl. No.: 16/954,451

(22) PCT Filed: Dec. 22, 2017

(86) PCT No.: PCT/EP2017/084546
§ 371 (c)(1),
(2) Date: Jun. 16, 2020

(87) PCT Pub. No.: WO2019/120588
PCT Pub. Date: Jun. 27, 2019

(65) Prior Publication Data
US 2021/0088558 A1 Mar. 25, 2021

(51) Int. Cl.
*G01R 15/24* (2006.01)
*G01R 33/032* (2006.01)

(52) U.S. Cl.
CPC ......... *G01R 15/246* (2013.01); *G01R 15/247* (2013.01); *G01R 33/0322* (2013.01)

(58) Field of Classification Search
CPC ............... G01N 22/00; G01N 24/008; G01N 2203/0641; G01R 31/2822; G01R 33/323; H05H 1/46; Y10S 427/104
See application file for complete search history.

(56) References Cited

U.S. PATENT DOCUMENTS 5,847,560 A 12/1998 Bosselmann et al.
6,208,129 B1 3/2001 Willsch et al.
(Continued)

FOREIGN PATENT DOCUMENTS

WO 2007121592 A1 11/2007
WO 2011125564 A1 10/2011
(Continued)

OTHER PUBLICATIONS

Herve C. Lefevre, "The Fiber-Optic Gyroscope", Second Edition, Artech House, 2014, 489 pages.
(Continued)

*Primary Examiner* — Tung X Nguyen
(74) *Attorney, Agent, or Firm* — Sage Patent Group

(57) ABSTRACT

In order to carry out the polarimetric detection of a measurand, light of two polarization states is passed through a sensing element, where the two states suffer a differential phase shift depending on the value of the measurand. In order to compensate for only imperfections of the device, a method is proposed that is based on calibration values obtained in a low-value regime of the measurand only. Yet the method can still be used for accurately determining higher values of the measurand.

20 Claims, 5 Drawing Sheets

(56) References Cited

U.S. PATENT DOCUMENTS

| | | | | |
|---|---|---|---|---|
| 2003/0198424 A1* | 10/2003 | Bennett | ............... | G01D 5/353 |
| | | | | 385/12 |
| 2014/0070802 A1* | 3/2014 | Yamada | ............ | G01R 33/032 |
| | | | | 324/244.1 |
| 2014/0071436 A1* | 3/2014 | Cyr | ................. | G01M 11/3163 |
| | | | | 356/73.1 |
| 2016/0305984 A1 | 10/2016 | Bohnert et al. | | |

FOREIGN PATENT DOCUMENTS

| | | |
|---|---|---|
| WO | 2014006121 A1 | 1/2014 |
| WO | 2015090448 A1 | 6/2015 |

OTHER PUBLICATIONS

K. Bohnert et al., "Fiber-Optic Current Sensor for Electrowinning of Metals", Journal of Lightwave Technology, vol. 25, No. 11, Nov. 2007, IEEE, pp. 3602-3609.

International Standard, "Instrument transformers—Part 8: Electronic current transformers", IEC 60044-8, First adition Jul. 2002, 12 pages.

International Search Report and Written Opinion of the International Searching Authority, PCT/EP2017/084546, dated Oct. 18, 2018, 9 pages.

K. Bohnert et al., "Temperature and vibration insensitive fiber-optic current sensor," Journal of Lightwave Technology, vol. 20, No. 2, Feb. 2002, pp. 267-276.

K. Kurosawa et al., "Polarization properties of flint glass fiber", Journal of Lightwave Technology vol. 13, No. 7, Jul. 1995, pp. 1378-1387.

K. Forrest et al., "Channel waveguides in glass via silver—sodium field assisted ion exchange", Journal of Lightwave Technology, vol. LT-4, No. 2, Feb. 1986, pp. 140-150.

R.C. Jones, "A new calculus for the treatment of optical systems. I. Description and discussion of the calculus", J. Opt. Soc. Am., vol. 31, Jul. 1941., pp. 488-493.

K. Kurosawa et al., "Development of an optical instrument transformer for DC voltage measurement", IEEE Transactions on Power Delivery, vol. 8, No. 4, Oct. 1993, pp. 1721-1726.

J. Hafner et al., "Proactive HVDC breakers key innovation for hybrid HVDC grids", Proceedings of Cigre International Symposium on "The electric power system of the future—Integrating supergrids and microgrids", Bologna, Italy, Sep. 13-15, 2011, 9 Pages.

* cited by examiner

POLARIZATION OPTICAL DETECTION WITH ENHANCED ACCURACY IN THE HIGH-SIGNAL REGIME

CROSS REFERENCE TO RELATED APPLICATIONS

This application is a 35 U.S.C. § 371 national stage application of PCT International Application No. PCT/EP2017/084546, filed on Dec. 22, 2017, the disclosure and content of which are incorporated by reference herein in its entireties. The above-referenced PCT International Application was published in the English language as International Publication No. WO 2019/1205888 A1 on Jun. 27, 2019.

FIELD OF THE INVENTION

The invention relates to a method and a sensing device for measuring an alternating measurand value by polarization-optical techniques.

BACKGROUND OF THE INVENTION

Fiber-optic current sensors (FOCS), e.g. for use in high-voltage substations, commonly use the Faraday effect in a coil of optical fiber around the current conductor (Ref. 1). High performance current sensors often use an interferometric technique as known from fiber gyroscopes (Ref. 2), where a closed-loop detection circuit with an integrated-optic phase modulator recovers the current-induced magneto-optic phase shift $\Delta\varphi$ between two light waves that propagate through the optical circuit. The closed-loop detection method ascertains a perfectly linear relationship between the sensor output and magneto-optic phase shift (Ref. 1)

By contrast, FOCS with simpler polarimetric detection schemes (Refs. 3-6) convert the magneto-optic phase shift or a corresponding polarization rotation by wave plates and polarizers into a change in the light intensity. The signal varies in proportion to the sine of the applied current. Frequently, the analyzer optics is configured to generate two signals of opposite phase. Their difference divided by the sum represents a normalized signal that is independent of variations in light-source power or insertion loss.

The unambiguous measurement range is limited to phase shifts within $\pm\pi/2$. The corresponding current range is about $\pm 310$ kA/N, wherein N is the number of fiber loops around the conductor. Here, it is assumed that the fiber coil consists of fused silica fiber, the wavelength of operation is 1310 nm, and light passes the coil twice (reflective mode). Without linearization of the sinusoidal response, a sufficiently linear output is obtained only at small phase shifts ($|\Delta\varphi|\ll 1$). To cover the full range of $\pm\pi/2$, the signal must be linearized by means of an arcsine-function or an equivalent thereof.

In a typical substation application of the sensor, the regime of small phase shifts ($|\Delta\varphi|\ll 1$) is relevant for metering whereas the range of high phase shifts is reserved for transient fault currents. Typically, the sensor must be able to measure fault currents up to at least 20 times the rated system current. Typical accuracy requirements are $\pm 0.2\%$ in the metering range and $\pm 5\%$ in the fault current range (Ref. 7).

FOCS, such as the one disclosed in Ref. 4, with polarimetric detection schemes introduce a 90°-phase bias between two light waves that propagate through the optical circuit by means of a quarter-wave retarder in order to shift the working point of the sensor (signal at zero current) into the linear range of the sensor response. Alternatively, a Faraday rotator crystal may set the bias (Ref. 6).

It is a general requirement of sensing techniques of this kind to provide good accuracy over a wide range of operating conditions.

SUMMARY OF THE INVENTION

Hence, the problem to be solved by the present invention is to provide a method and device of the type mentioned above that yield results of good accuracy while obviating the need for extensive calibration measurements.

This problem is solved by the method and device of the independent claims.

The method is used to measure a value Z of an alternating measurand. Note that in the context of the present invention the term "alternating measurand" is meant, if not stated otherwise, to include any measurand that varies as a function of time. This includes period measurands such as AC currents or AC voltages (e.g. with frequencies of 50 Hz or 60 Hz), transient measurands as well as combinations of periodic and transient phenomena. The latter may be, for example, an AC current with a transient DC offset which may occur in situations of faults in a 3-phase system such as a shorted circuit. Another example are spike- or pulse-like transient measurands, e.g. current pulses with durations in the microsecond or millisecond regime that may occur at high voltage DC circuit breakers during current interruption [13]. Another example are plasma current pulses, e.g. at tokamaks for nuclear fusion research.

The method of the present invention comprises the following steps:

1) Sending two different polarization states of a light beam through a sensing element, where the two polarization states experience a measurand-dependent differential phase shift $\Delta\varphi$. Same as the measurand, the phase shift $\Delta\varphi$ is alternating, e.g. at a certain frequency and/or in transients.

2) Splitting the light having passed at least once through said sensing element into at least two channels and carrying out different polarimetric measurements in the two channels, thereby generating two raw signals $S_{1,raw}$, $S_{2,raw}$ depending on the phase shift $\Delta\varphi$ as follows $$S_{1,raw}=(S_{o1}/2)\cdot[1+K_1 \sin(\Delta\varphi+\theta_1)]$$

$$S_{2,raw}=(S_{o2}/2)\cdot(1-K_2 \sin(\Delta\varphi+\theta_2)]$$

Herein, the following parameters (i.e. values independent of $\Delta\varphi$) are used:

$S_{o1}$, $S_{o2}$ are parameters depending at least on the light source power and optical losses in the sensing device;

$K_1$, $K_2$ are parameters of the sensing device and correspond to the contrasts of the two raw signals $S_{1,raw}$, $S_{2,raw}$;

$\theta_1$, $\theta_2$ are parameters depending at least on the sensing device and having an absolute value much smaller than $\pi/2$. Advantageously, $|\theta_1|$, $|\theta_2|$ each are smaller than 10°.

3) Normalizing the raw signals $S_{1,raw}$, $S_{2,raw}$ to two signals $S_1$, $S_2$ of equal amplitudes ($Y_o/2$), i.e.

$$S_1=(Y_o/2)\cdot[1+K_1\cdot\sin(\Delta\varphi+\theta_1)] \text{ and}$$

$$S_2=(Y_o/2)\cdot(1-K_2\cdot\sin(\Delta\varphi+\theta_2)].$$

In this context, "equal amplitude" advantageously means that the signals have an equal amplitude within 5%, in particular within 2%, more particularly within 1%, or have an essentially equal amplitude.

3) Calculating a normalized combined signal S using a normalization value C as $$S=(S_1-S_2)/C.$$

The normalization value C is calculated by one of the two following options:
From previous values $S_1'$, $S_2'$ of the sensor signals $S_1$, $S_2$, near zero crossings of the measurand. Advantageously, C is calculated as $C=S_1'+S_2'$.
In an iterative approach.

"Near zero crossings of the measurand" is to be understood as those time periods during the cycles of the alternating measurand where $|\Delta\varphi|<<\pi/2$, in particular $|\Delta\varphi|<0.1$.

4) Calculating the value Z of the measurand as an arcsine function of S multiplied by a calibration coefficient: This step advantageously uses the parameters $K_1$, $K_2$, $\theta_1$, and/or $\theta_2$. In addition, an offset optionally can be added to the arcsine function, and/or the arcsine function can be multiplied by a calibration factor.

Advantageously, to normalize the raw signals $S_{1,raw}$, $S_{2,raw}$, time-averaged amplitudes $S_{o1,ac}$ and $S_{o2,ac}$ at the alternating frequency of the measurand are calculated and the signals $S_1$, $S_2$ are calculated as $$S_1=S_{1,raw}\cdot S_{o2,ac} \text{ and}$$

$$S_2=S_{2,raw}\cdot S_{o1,ac}.$$

The present invention provides a signal processing concept for polarimetric sensors for which it is sufficient to calibrate the sensor for small measurand values (i.e. at differential phase shifts $|\Delta\varphi|<<\pi/2$), in particular as a function of temperature, and that avoids the need of a calibration in the large measurand regime.

It allows one to derive the sensor calibration for large measurand values (e.g. in the fault-current regime of a magneto-optic current sensor) at phase shifts up to $\pm7c/2$ with high accuracy from the low-signal scale factor and some pre-determined sensor parameters.

Hence, the invention provides a signal processing concept that keeps the effort and cost for sensor calibration moderate. The distortion in the sinusoidal response of the sensor caused by non-zero phase offsets ($\theta_1$, $\theta_2$) in the two detector signals can e.g. be largely avoided, if the difference of the two signals (anti-phase signals) is normalized at all current magnitudes by the low-signal value of the sum of the two signals (Approach A).

The method is of particular advantage, if $\theta_1 \neq 0$, $\theta_2 \neq 0$, $\theta_1 - \theta_2 \neq 0$, $K_1 \neq 1$, and/or $K_2 \neq 1$ at at least one temperature in an operating temperature range of the sensing device, and/or if the phase shift $|\Delta\varphi|$ reaches values larger than 0.1 rad, in particular larger than 0.5 rad, in particular larger than 1 rad.

The operating temperature range is a temperature range for which operation of the sensing device is specified, e.g. in a manual or in a data sheet; in preferred embodiments, the operating temperature range is $-55°$ C. to $85°$ C., or $-40°$ C. to $85°$ C., or $-20°$ C. to $55°$ C.

In one class of embodiments, the correction value C is given by a sum of the signals $S_1'$ and $S_2'$ with $S_1'$, $S_2'$ being the values of $S_1$, $S_2$ corresponding to phase shifts $\Delta\varphi$ having an absolute value smaller than a threshold. Advantageously, the threshold is much smaller than $\pi/2$, in particular below 0.1 rad.

In one sub-embodiment thereof, $S_1'$ and $S_2'$ can be determined as time-averaged values of $S_1$ and $S_2$ during time periods where $|\Delta\varphi|$ is below said threshold. This determination is carried out over at least one half-cycle of the alternating measurand.

In another sub-embodiment thereof, the value C is determined by determining the extremum of the sum of $S_1+S_2$ within at least one half-cycle of the alternating measurand. Advantageously, for increased accuracy, C can be calculated by averaging the obtained extrema over more than one half-cycle of the measurand.

In a second class of embodiments, where an iterative approach is used, the value C is calculated in an iterative approach, in iterations n with $n=0, \ldots, N-1$, with n and N being integers.

In this case, C is derived from C(n), with C(n) being a function of $\Delta\varphi(n)$. $\Delta\varphi(n)$ is an iterative value for the phase shift $\Delta\varphi$, and $\Delta\varphi(n+1)$ is calculated from C(n), in particular by calculating from C(n) iterative values S(n) for S and Z(n) for Z.

Advantageously, $C(n)=(S1+S2)\times k_0/k(n)$ with $k_0=1/[1+K\cdot\cos(\theta)\cdot\sin(\Delta\theta/2)]$ and $k(n)=1/[1+K\cdot\cos\{\theta+\Delta\varphi(n)\}\cdot\sin(\Delta\theta/2)]$, with K being an effective fringe contrast and $\theta=(\theta_1+\theta_2)/2$.

In the second class of embodiments, N is advantageously 1 or larger and, in the first iteration $\Delta\varphi(0)$, is set to a starting value (i.e. an initial estimate), in particular to zero.

In both classes, the value Z can e.g. be calculated as $$Z = \frac{1}{A} f(\theta_1, \theta_2, K_1, K_2) \arcsin\left[\frac{S}{f(\theta_1, \theta_2, K_1, K_2)}\right] + H$$

with
A being a scale factor;
f being a function of at least one of the parameters $\theta_1$, $\theta_2$, $K_1$, $K_2$; and
H is an offset value, in particular a value of Z near zero-crossings of said measurand,
and in particular wherein $$f(\theta_1,\theta_2,K_1,K_2)=k_0 K \cos[\Delta\theta/2],$$

with $$k_0=1/[1+K\cdot\cos(\theta)\cdot\sin(\Delta\theta/2)],$$

K being an effective fringe contrast of S, $\theta=(\theta_1+\theta_2)/2$, $\Delta\theta=\theta_1-\theta_2$, and
with the offset value H given as $$H=-S_o/A$$

with $S_o$ being a signal offset at a zero value Z, and wherein said scale factor A is given as $$A=A'/\cos\theta$$

with A' being a scale factor determined by calibration in a regime of $|\Delta\varphi|<<\pi/2$, in particular $|\Delta\varphi|<<0.1$.

In both the first and the second class of embodiments, A' is advantageously obtained from calibration data as a function of a temperature of at least part of said device, in particular as a function of the temperature of the beam splitter.

The effective fringe contrast K can be a function of $K_1$ and $K_2$. In preferred embodiments, the effective fringe contrast K can be calculated from $K_1$ and $K_2$, e.g. as arithmetic average $(K_1+K_2)/2$, geometric average $(K_1 \cdot K_2)^{1/2}$ or as $2K_1 \cdot K_2/(K_1+K_2)$.

Advantageously, the parameters $\theta=(\theta_1+\theta_2)/2$, $\theta_1$, $\theta_2$, $\Delta\theta=\theta_1-\theta_2$, $K_1$, and/or $K_2$ are calculated from calibration data as a function of the temperature of at least part of the sensing device or of a value indicative of the temperature of at least part of said sensing device. It goes without saying that other parameters depending on at least one of the aforementioned parameters can also be used. For example, in embodiments where an effective fringe contrast K is used, K can be calculated directly from calibration data or via $K_1$ and $K_2$.

E.g. in a simple embodiment, the parameters $K_1$ and $K_2$ can be assumed to be 1. In other embodiments, $K_1$ and $K_2$ can be calculated from further parameters of the sensing device, such as the retardation of a retarder at the entrance of a sensing fiber of a fiber-optic current sensor.

For normalizing the raw signals $S_{1,raw}$, $S_{2,raw}$, time-averaged amplitudes $S_{o1,ac}$ and $S_{o2,ac}$ at an alternating frequency of the measurand can be calculated. In that case, the signals $S_1$, $S_2$ can be calculated as $S_1 = S_{1,raw} \cdot S_{o2,ac}$ and $S_2 = S_{2,raw} \cdot S_{o1,ac}$ The apparatus can e.g. comprise A beam-splitter, in particular an integrated-optic beam splitter, connecting at least three downstream terminals to at least one upstream terminal.

A light source connected to a first downstream terminal D1.

A first polarizer and a first light detector arranged to measure said first raw signal $S_{1,raw}$ from light returning from said sensing element at a second downstream terminal.

A second polarizer and a second light detector arranged to measure said second raw signal $S_{2,raw}$ from light returning from said sensing element at a third downstream terminal.

The first and second polarizers are orthogonally polarized, and the upstream terminal is connected to the sensing element.

Furthermore, a quarter-wave retarder may be arranged either between said first polarizer and said first downstream terminal or between said first and second polarizers and said second and third downstream terminals.

Furthermore, the method can comprise the steps of measuring the temperature of said beam-splitter, and calculating the parameters $K_1$, $K_2$, $\theta_1$, and/or $\theta_2$ as a function of said temperature. Advantageously, this can be carried out by using calibration data obtained in calibration measurements on the beam-splitter. The calibration data describe the temperature dependence of the parameters.

The temperature of the beam-splitter can e.g. be determined from an accordingly calibrated signal-offset $S_0$ at Z=0 or by means of a temperature sensor.

To compensate nonlinearities, the method can further comprise the step of calculating a refined value Z" of the measured value Z of the measurand from $Z'' = g(Z) \cdot Z$, wherein g(Z) is a normalized correction function.

For example, the measurand can be an electrical current in a conductor, and the sensing element is a fiber wound at least once around the conductor.

In another example, the measurand can be an electrical field or voltage, and the sensing element is an element exhibiting the electro-optic Pockels effect and is placed in said field or in a field proportional to the voltage.

The invention also relates to a sensing device comprising a sensing element and a signal processing unit configured to execute the methods described here.

BRIEF DESCRIPTION OF THE FIGURES

The invention will be better understood and objects other than those set forth above will become apparent in view of the following detailed description thereof. This description makes reference to the annexed drawings, wherein.

DETAILED DESCRIPTION

1. Sensor Configuration

Figure 1:
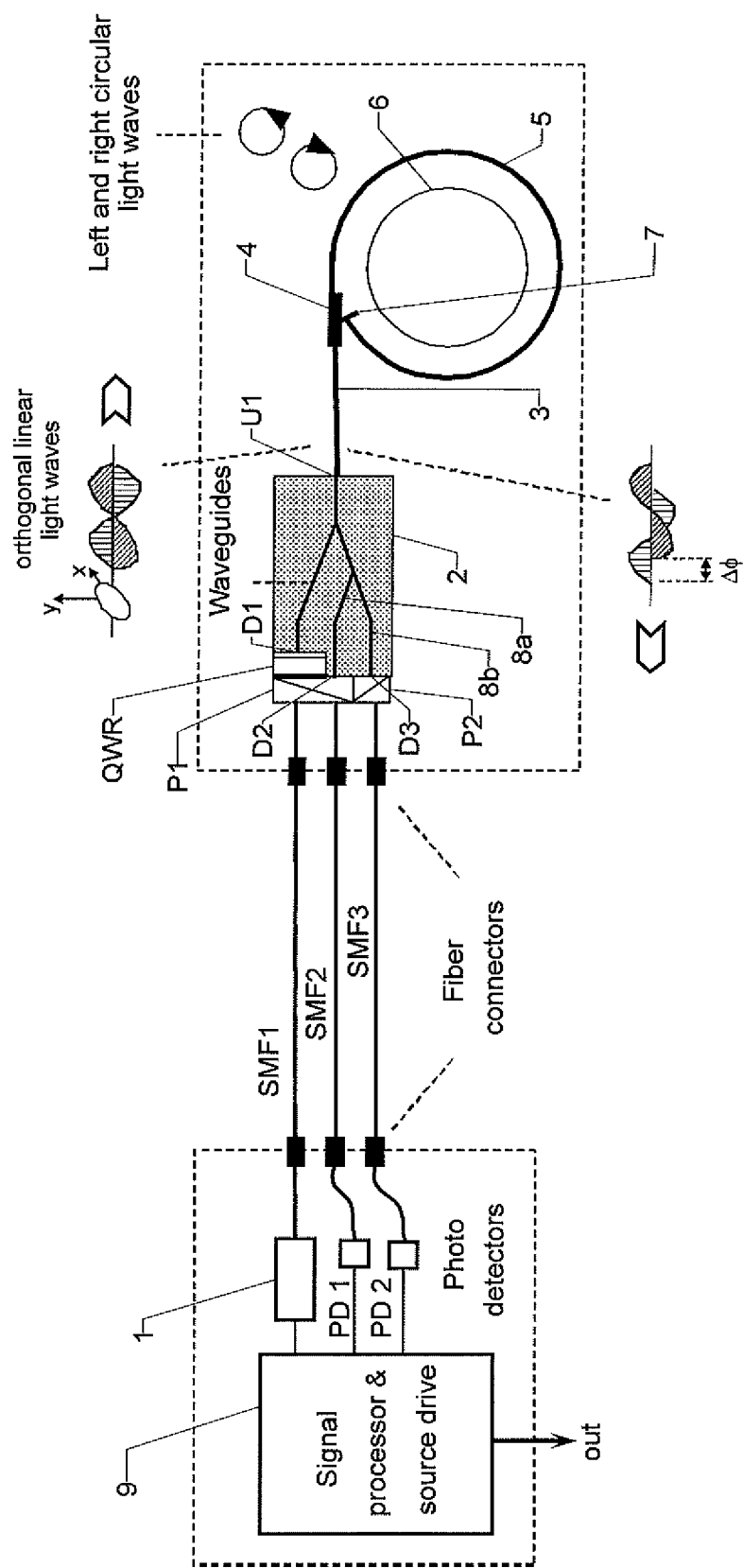
FIG. 1 shows an embodiment of a sensing device.

FIG. 1 shows a polarimetric fiber-optic measuring device according to prior art (Refs. 3, 4). Light from a broad-band light source 1, e.g. a superluminescent diode, is depolarized by a fiber Lyot depolarizer (not shown) and transmitted via a single-mode optical fiber SMF1 to an integrated-optic 1×3 splitter 2 (PLC splitter, planar lightwave guide circuit).

At the source-side facet, the splitter 2 has at least three "downstream terminals" D1-D3, which are connected to at least one "upstream terminal" U1 at the coil-side facet.

The light from light source 1 passes a polarizer P1 and a quarter-wave retarder QWR, and then it enters downstream terminal D1. At the coil-side facet, the light couples from upstream terminal U1 into a polarization-maintaining (PM) fiber 3.

The polarizer P1 is oriented at 45° to the principal axes of the PM fiber 3. Preferably, the fiber axes of fiber 3 are parallel and orthogonal to the normal of the splitter chip of beam splitter 2, i.e. polarizer P1 is aligned at 45° to the splitter normal.

The principal axes of quarter-wave retarder QWR are at 45° to polarizer P1 and parallel to the axes of fiber 3. Hence, the retarder introduces a phase delay of $(2m+1)\pi/2$ between the two orthogonal linearly polarized light waves that enter the PM fiber 3. Here, m is the order of the retarder, m=0, 1, 2 . . . .

A fiber-optic quarter-wave retarder 4 converts the orthogonal light waves from fiber 3 into left and right circularly polarized waves before the light enters a sensing fiber 5 (or, more general, a sensing element). Sensing fiber 5 forms a coil with an integer number of fiber loops around the current conductor 6.

The light reflects off a reflective coating or reflector 7 at the far end of sensing fiber 5 and then passes the sensing fiber a second time. Upon reflection, the polarization states of the two light waves or modes are swapped, i.e. left circular light becomes right circular and vice versa.

Retarder 4 converts the reflected circular waves back to orthogonal linear waves. The polarization directions of the returning linear waves are also swapped compared to the forward propagating waves. The returning orthogonal waves have a differential magneto-optic phase shift $\Delta\varphi$ as a result of the Faraday effect.

They return through fiber 3 and upstream terminal U1 into splitter 2.

Splitter 2 splits the returning light into two detection channels 8a, 8b, which end at the downstream terminals D2 and D3. The orthogonal waves of each channel 8a, 8b interfere at polarizers P1, P2. The polarizers are at +45° and −45° to the splitter normal.

Note that polarizer P1 is in the present embodiment common to the light source channel and detector channel.

Two further single mode fibers (SMF2, SMF3) guide the light transmitted through the polarizers to two photodetectors PD1, PD2. The detection channels 8a, 8b may comprise depolarizers (not shown) in order to avoid or reduce polarization dependent loss.

Typically, sensing fiber 5 is a low-birefringent fiber or a spun highly birefringent fiber.

Preferably, the waveguides of splitter 2 are of low birefringence, and retarder QWR resides in a stress-free manner in a recess of the splitter facet (Ref. 4). The waveguides may be fabricated in a glass substrate by electric-field-assisted ion exchange (Ref. 8).

The sensing device further comprises a signal processing unit 9 adapted and structured to carry out the steps of the method described here. Signal processing unit 9 may e.g. comprise a microcontroller, data and program memory, and the software and hardware required to execute the necessary steps. It further comprises interface elements for interfacing with the other components of the sensing device and with secondary electronic devices, e.g. protection relays. Furthermore, the signal processing unit may be configured to interrogate more than one, in particular three sensing elements.

Sensor Signal

The two raw detector signals measured by the photodetectors PD1, PD2 can be written as $$S_{1,raw} = (S_{o1}/2) \cdot [1 + K_1 \cdot \sin(\Delta\varphi + \theta_1)] \quad (1)$$

$$S_{2,raw} = (S_{o2}/2) \cdot [1 - K_2 \cdot \sin(\Delta\varphi + \theta_2)] \quad (2)$$

The magneto-optic phase shift $\Delta\varphi$ is given as $$\Delta\varphi = 4NVI \quad (3)$$

N, V, I are the number of windings of the fiber coil, the Verdet constant of fiber (~1 mrad/A at 1310 nm for fused silica fiber), and the current, respectively. Eq. (3) assumes an ideal fiber coil (free of linear birefringence) and a perfect fiber quarter-wave retarder. Deviations from the ideal case are discussed further below. The fringe contrast terms $K_i$ (i=1, 2) are also explained in more detail below.

The phase terms $\theta_1$, $\theta_2$ are the deviations of the phase bias from a perfect 90°-bias of the returning waves at the polarizers P1 and P2 for zero current (zero measurand). They are mainly determined by properties of the splitter 2 and the quarter-wave retarder QWR. Possible contributions to these phase offsets are a deviation of the splitter quarter-wave retarder QWR from perfect 90°-retardation (e.g. in case of retarder tilt relative to the beam direction; for example, the retarder is tilted, if the splitter facets are polished at an angle to suppress back reflections) and contributions from the splitter waveguides.

Under ideal conditions, differential phase shifts due to waveguide birefringence cancel out over a full roundtrip of the light due to the swapped polarization directions of the light waves on the return path. However, if the birefringence in the three waveguide branches of the splitter is not identical, non-zero net phase shifts will remain. For example, the birefringent phase retardation of the splitter may correspond to a few hundred degrees for a single pass, and the remaining (uncompensated) retardation after a roundtrip of the light may be up to a few degrees. (Note that the principal axes of the waveguide birefringence, if present, are commonly oriented parallel and orthogonal to the splitter substrate).

Due to the temperature dependence of the retarder, the phase offsets $\theta_1$, $\theta_2$ vary with temperature, at rates of 0.91 degrees/100° C. and 2.73 degree/100° C. for zero-order and first order quartz retarders, respectively.

A further contribution to the temperature dependence is due to an unbalanced waveguide birefringence. For adequately designed splitters, this contribution is small or negligible, however. If it is non-negligible, not only the individual offsets $\theta_1$, $\theta_2$ are temperature dependent, but also their difference may change with temperature. The resulting implications are discussed further below.

$\theta_1$, $\theta_2$ can be obtained from calibration measurements on beam-splitter 2 as a function of its temperature.

The fringe contrast terms $K_i$ in Eq. (1) and (2) are composed of contributions from the splitter and the fiber coil:

$$K_i K_{i,s} K_c \quad (4)$$

The coil contribution $K_c$ is the same for both signals $S_{1,raw}$, $S_{2,raw}$ whereas the contributions $K_{i,s}$ from the splitter may somewhat differ. For an ideal sensor, $K_{i,s}$ and $K_c$ are equal to unity. In practice, $K_{i,s}$ may be reduced, e.g. due to an imperfect angular orientation of the polarizers, splitter retarder, and the PM fiber.

The coil contrast $K_c$ can be expressed as:

$$K_c = K_\delta(T) \cos[\varepsilon'(T)] \quad (5)$$

The term $K_\delta$ is a function of the bend-induced birefringent phase retardation $\delta$ of the sensing fiber. The phase term $\varepsilon'$ is represented by $$\varepsilon'(T) = 90° + \delta'(T) - \rho(T). \quad (6)$$

Here, $\rho$ is the retardation of the fiber retarder 4, and $\delta'$ is a phase angle depending on the coil retardation $\delta$ and the angle $\beta$ between the slow fiber retarder axis and the coil normal (slow axis of the coil birefringence). For the special cases of $\beta = 0°$, 45°, 90°, the term $\delta'$ corresponds to $\delta' = -\delta$, 0, and $\delta$, respectively. For other values of $\beta$, $\delta'$ is between $-\delta$ and $+\delta$.

In preferred embodiments the contrast K for the combined detector signal S (see below), i.e. the effective fringe contrast, can be calculated from $K_1$ and $K_2$, e.g. as arithmetic average $(K_1 + K_2)/2$, geometric average $(K_1 \cdot K_2)^{1/2}$, or as $2K_1 \cdot K_2 / (K_1 + K_2)$.

As mentioned further above, the $\pi/2$-phase-bias between the interfering light waves may be introduced by means other than a quarterwave retarder, in particular a Faraday rotator crystal (Ref. 6).

Imperfections

Imperfections of the analyzer optics (e.g. due to undesired birefringence) or of the rotator crystal give rise to deviations from a perfect 90°-phase-bias. Furthermore, the extra phase offsets ($\theta_1$, $\theta_2$) may be different in the two (anti-phase) detector channels and vary with temperature. As a consequence, the combined signal of the two channels is no longer a perfect sine-function but distorted. The distortions increase with increasing difference of $\theta_1$, $\theta_2$. Hence, the linearization of the signal by an arcsine-function is no longer fully adequate and leads to errors, which become the larger the closer the magneto-optic phase shift gets to $\pm\pi/2$. As a result, the usable measurement range may be substantially smaller than $\pm\pi/2$.

Another phenomenon that causes errors is that the fringe contrast of the two detector signals and thus the amplitude of the normalized combined signal is smaller than unity (ideal case) and changes with temperature due to temperature dependent birefringent phase shifts at the fiber coil (fiber retarder, bend-induced fiber birefringence).

All adverse effects can theoretically be taken into account by a two-dimensional calibration of the sensor, i.e. a calibration over the entire $\pm\pi/2$-range of magneto-optic phase shifts and operating temperatures, for example from $-40$ to $85°$ C. However, such a calibration represents a substantial extra effort and complication, and currents as high as 100 kA and beyond may be required in some cases. The present invention provides a more efficient approach that does not necessarily require calibrations over a large range of currents.

2. Temperature Compensated Fiber Coil

In a preferred embodiment, the retardation $\rho_o$ at a reference temperature (commonly room temperature) is chosen such that, at small phase shifts $\Delta\varphi$, the term $\cos[\varepsilon'(T)]$ in the beam splitter contrast $K_\delta$ compensates the variation of Verdet constant in the argument of the sine-functions of Eq. (1) and (2). (For simplicity, we assume that the variation of $K_\delta$ (see Eq. 5, 6) with temperature is small compared to the variation in $\cos \varepsilon'$). The compensation technique has been disclosed in Ref. 3 for polarimetric sensors with a fiber coil of negligible linear birefringence ($\delta=0$) and in Ref. 9 for the case of spun, highly birefringent fiber.

Figure 2:
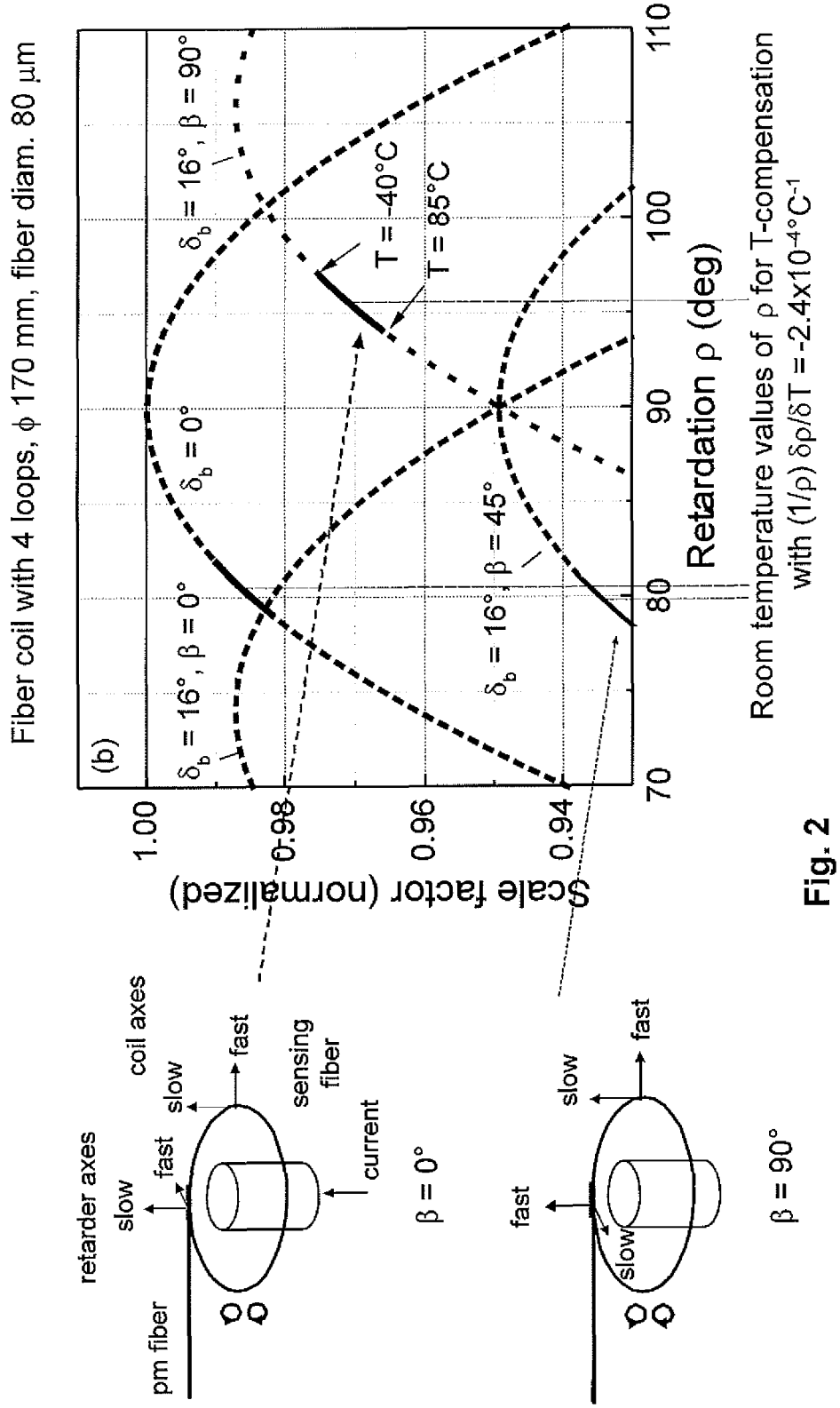
FIG. 2 shows the normalized scale factor of a fiber optic current sensor as a function of the retardation of a quarter-wave retarder for different bend-induced birefringence of the sensing fiber coil ($\delta_b=0°$, $\delta_b=16°$) and three different orientations of the slow axis of the retarder with respect to the slow axis of the coil ($\beta=0°$, $\beta=45°$, $\beta=90°$).

For completeness, FIG. 2 illustrates the situation for a low-birefringent sensing fiber coil with bend-induced birefringence. Here we assume we have a coil with a birefringent phase retardation of $\delta=16°$. (This corresponds, for example, to a coil with four fiber loops with a diameter of 170 mm, a fiber diameter of 80 mm, and a wavelength of 1310 nm). FIG. 2 depicts the small current sensor scale factor (i.e. for $|\Delta\varphi|\ll 1$) (defined as signal change per infinitesimal current change) in normalized units as a function of the retardation $\rho$ for three different fiber retarder orientations) $\beta$ (0°, 45°, 90°) and $\delta=0°$ and 16°; derived by describing the light propagation by means of the Jones matrix formalism (Ref. 10). The curves represent the term $K_\delta \cos[\varepsilon']$. If we assume that the retarder has a temperature dependence of $(1/\rho) \delta\rho/\delta T=-2.4\times10^{-4°}$ C.$^{-1}$, the room temperature retardation $\rho_o$ must be chosen according to the vertical dashed lines for the three indicated cases in order to achieve temperature compensation. The decrease of the scale factor along the corresponding heavy curve segments at rising temperature largely balances the increase in the Verdet constant V; $(1/V) \delta V/\delta T=0.7\times10^{-4°}$ C.$^{-1}$.

It should be noted that, for a fiber retarder that deviates from perfect quarter-wave retardation, a sensing fiber with bend-induced birefringence, or a spun birefringent sensing fiber, the magneto-optic phase shift $\Delta\varphi$ is no longer perfectly proportional to the current I and may exhibit a certain degree of non-linearity (Refs. 9, 12).

3. Combined Normalized Sensor Signal

The amplitudes $S_{o1}$, $S_{o2}$ in Eq. (1) and (2) are proportional to the light source power. Different insertion loss in the sensing device is taken into account by normalizing the two channels to equal power with procedures as disclosed in Ref. 4.

A preferred procedure is to filter out, in each channel, the AC signal component (component at the current frequency) and to multiply the signal of the respective other channel with a time-averaged amplitude of this component. That is, channel 1 is multiplied with a term proportional to $(S_{o2,raw}/2)\cdot K\cdot\cos \theta_2$ and channel 2 is multiplied with a term proportional to $(S_{o1,raw}/2)\cdot K\cdot\cos \theta_1$ (with K as given further above), i.e. the amplitudes after normalization are given by $(S_{o1}/2)\cdot(S_{o2}/2)\cdot K\cdot\cos \theta_2$ and $(S_{o1}/2)\cdot(S_{o2}/2)\cdot K\cdot\cos \theta_1$. Note that unequal phase offsets $\theta_1$, $\theta_2$ result in a slight asymmetry in the amplitudes of the normalized signals corresponding to a factor $\cos(\theta_1)/\cos(\theta_2)$. Since, commonly, the individual values and the difference of $\theta_1$, $\theta_2$ are small (e.g. $\Delta\theta=\theta_1-\theta_2<2°$), we neglect the effect for the further considerations.

Further, it is noted that $(S_{o1}/2)\cdot K\cdot\cos \theta_1$ and $(S_{o2}/2)\cdot K\cdot\cos \theta_2$ can e.g. be obtained by the methods of Ref. 4.

(Note: In order to prevent erroneous normalization in case of very small or vanishing current signals or during large transient signals, updating of the normalization factors is interrupted, if the signal amplitudes fall below or exceed preset thresholds, e.g. during transient measurand peaks.)

According to prior art, the difference of the two power-normalized signals $S_1$, $S_2$ divided by their sum results in combined normalized signal S independent of $S_{o1}$, $S_{o2}$ and hence independent of variations in light source power or insertion losses. If we assume $\theta_1=\theta_2=0$, one obtains:

$$S=K\cdot\sin \Delta\varphi, \quad (7)$$

and for $|\Delta\varphi|\ll 1$:

$$S=K\cdot\Delta\varphi \quad (8)$$

A number of modifications occur, if the phase offsets $\theta_1$, $\theta_2$ have non-zero values. The sensor signal becomes erroneous, particularly at large magneto-optic phase shifts, if the offsets are not properly taken into account. The following discloses modified signal processing methods and corresponding sensor calibration procedures that avoid such errors.

We rewrite Eq. (1, 2) as $$S_1=(\tfrac{1}{2})Y_o[1+K \sin(\Delta\varphi+\theta_1)] \quad (9)$$

$$S_2=(\tfrac{1}{2})Y_o[1-K \sin(\Delta\varphi+\theta_2)] \quad (10)$$

Here, $(\tfrac{1}{2})Y_0$ is the amplitude of the two raw signals after they have been normalized to equal power. The difference and the sum of the two signals is then given as $$S_1-S_2=Y_o\cdot\sin[\Delta\varphi+(\theta_1+\theta_2)/2]\cdot\cos[(\theta_1-\theta_2)/2] \quad (11)$$

$$S_1+S_2=Y_o\cdot\{1+K \cos[\Delta\varphi+(\theta_1+\theta_2)/2]\cdot\sin[(\theta_1-\theta_2)/2]\} \quad (12)$$

The combined normalized signal $S=(S_1-S_2)/(S_1+S_2)$ can then be written as:

$$S=k\cdot K\cdot\cos(\Delta\theta/2)\cdot\sin(\Delta\varphi+\theta) \quad (13)$$

with $$k=1/[1+K\cdot\cos(\Delta\varphi+\theta)\cdot\sin(\Delta\theta/2)] \quad (14)$$

$$\Delta\theta=\theta_1-\theta_2 \quad (15)$$

$$\theta=(\theta_1+\theta_2)/2 \quad (16)$$

The dependence of k on the phase shift $\Delta\varphi$ is a measure for the deviation of signal S from a pure sinusoidal dependence of $\Delta\varphi$.

Figure 3:
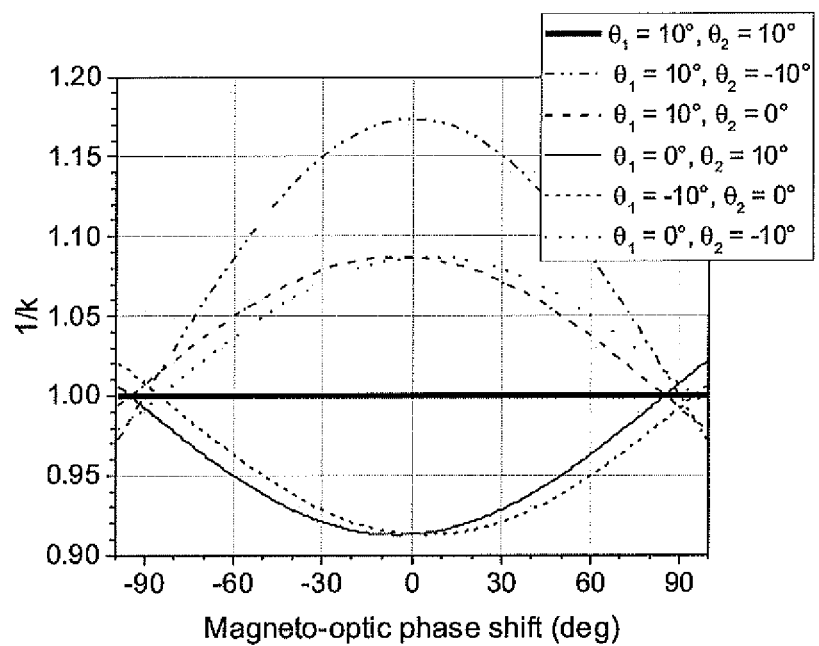
FIG. 3 shows the term 1/k as a function of the phase shift $\Delta\varphi$ for various deviations $\theta_1$, $\theta_2$ from perfect 90° phase bias.

It is apparent that, if $\Delta\varphi\neq 0$, the signal S is no longer a perfect sine-function of the magneto-optic phase shift $\Delta\varphi$, but is distorted by the current (phase shift)-dependent term k in the amplitude. For illustration, FIG. 3 shows 1/k as function of $\Delta\varphi$ for various combinations $\theta_1$, $\theta_2$.

At small currents ($|\Delta\varphi| \ll 1$), Eq. (13) can be approximated as $$S = k \cdot K \cdot \cos(\Delta\theta/2) \cdot [(\cos\theta) \cdot R \cdot I + \sin\theta] \qquad (17)$$

Here, $\Delta\varphi$ has been replaced by the current I and a proportionality factor R. R is essentially given by the product of the Verdet constant of the sensing fiber and the number N of fiber loops. As mentioned above, the parameters of the fiber retarder (in case of a non-90°-retarder) and bend-induced fiber birefringence also affect the value of R and may introduce some current dependence: R=R(I). Similarly, in case of a spun highly birefringent sensing fiber, the spin pitch and embedded linear birefringence play a role.

At small $\Delta\varphi$, $\theta$, and $\Delta\theta$, the term k is approximately given by $k = k_o \approx 1 - K \cdot \sin(\Delta\theta/2)$.

The signal offset $S_o$ at zero current is given as $$S_o = k \cdot K \cdot [\cos(\Delta\theta/2)] \cdot \sin\theta \qquad (18)$$

Sensor calibration at small AC current ($|\Delta\varphi| \ll 1$) as a function of temperature gives the small current scale factor A' (T)=$\delta S/\delta I$ at small values of I:

$$A'(T) = k \cdot K \cdot R \cdot \cos(\Delta\theta/2) \cdot \cos\theta \qquad (19)$$

Inverse Signal

Figure 4:
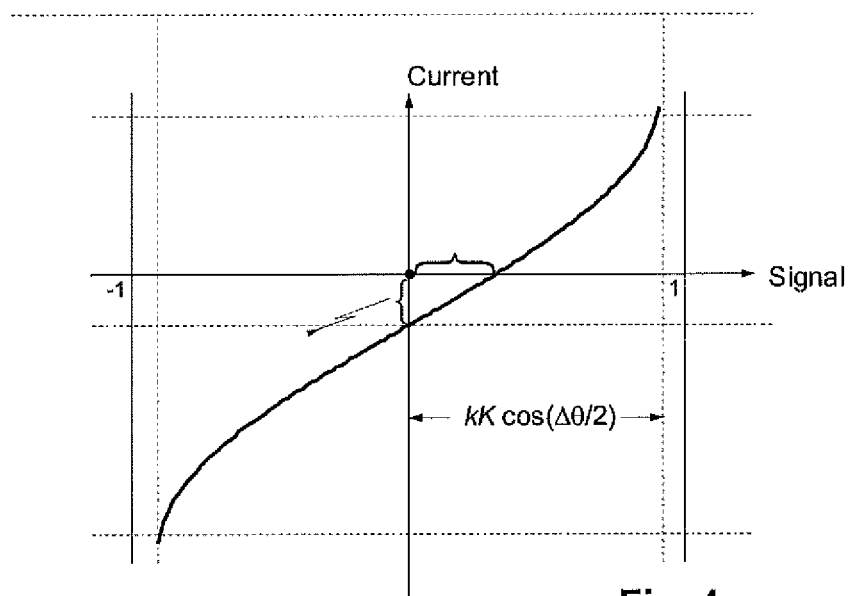
FIG. 4 shows the current versus the signal S.

The signal processor of the sensor determines the current from the signal S by means of the inverse of Equation (13), FIG. 4:

$$I = \frac{1}{R}\arcsin\left[\frac{S}{kK\cos[\Delta\theta/2]}\right] - \frac{\theta}{R} \qquad (20)$$

Inserting the low-current scale factor A' from Eq. (19) and $S_o$ from Eq. (18) yields $$I = \frac{\cos\theta}{A'}kK\cos[\Delta\theta/2]\arcsin\left[\frac{S}{kK\cos(\Delta\theta/2)}\right] - \frac{S_0}{A'}\cos\theta \qquad (21)$$

The $\cos\theta$– term in Eq. (21) can be approximated by $$\cos\theta \approx \cos S_o \qquad (22)$$

This follows from $\theta = \arcsin\{S_o/[k_o \cdot K \cdot \cos(\Delta\theta/2)]\}$, Eq. (18), with the assumptions that $k_o$, K are near unity and $S_o$ and $\Delta\theta$ are small.

Eq. (21) can then be rewritten as:

$$I = \frac{\cos(S_0)}{A'}kK\cos[\Delta\theta/2]\arcsin\left[\frac{S}{kK\cos(\Delta\theta/2)}\right] - \frac{S_0}{A'}\cos S_0 \qquad (23)$$

$\theta_1$, $\theta_2$ (and hence $\Delta\theta$), and K can be obtained from corresponding calibration measurements on the device. A' can be obtained by calibration the sensing device at low AC current ($\Delta\varphi \ll 1$). Preferably, all calibration measurements are done as a function of temperature within the foreseen operating temperature range.

The signal offset $S_o$ at zero current (zero measurand) can e.g. be obtained by low pass-filtering the signal S (preferred) or by low-pass filtering the two individual detector signals (after they have been normalized to equal power) and dividing their difference $S_{1,DC}$ and $S_{2,DC}$ by their sum:

$$S_o = \frac{S_{1,DC} - S_{2,DC}}{S_{1,DC} + S_{2,DC}} \qquad (24)$$

(In this context, low-pass filtering is understood as a filtering or averaging over a time typically much larger than the cycle time of the current (measurand)).

Note that at small signals ($|S| \ll 1$) the terms $k \cdot K \cdot \cos(\Delta\theta/2)$ in the amplitude and argument of the arcsine-function of Eq. (21) cancel each other. The terms are important, though, for correct linearization of the current signal at higher values of S. Errors in the term $k \cdot K \cdot \cos(\Delta\theta/2)$ will lead to signal errors in the high-current regime. The signal S in Eq. (21, 22) is the complete signal including AC terms and the DC offset $S_o$. The $\cos\theta$-term in the amplitude of the arcsine-function of Eq. (21) and, equivalently, the $\cos(S_o)$-term in Eq. (23) take into account that the working point (signal at zero current) is not at S=0 but at S=$S_o$. (Note: As an alternative, one can work with the high-pass filtered signal in the argument of the arcsine-function and omit the $\cos\theta$-term in the amplitude, which, however, will lead to errors at large signals).

4. Signal Errors in the High Current Regime and their Elimination

From the above equations, it is obvious that there can be substantial signal errors in the high current regime (phase shifts $\Delta\varphi$ approaching $\pm\pi/2$) in case of non-zero phase offsets $\theta_1$, $\theta_2$ and uncertain fringe contrast of the splitter and fiber coil, $K_s$ and $K_c$, if these parameters and their variation with temperature are not properly taken into account.

4.1 Errors Due to Phase Offset Difference $\Delta\theta$

The errors in the signal S versus current I (magneto-optic phase shift $\Delta\theta$) as a result of the current-dependence of the term k, Eq. (14), amount to about $-\sin(\Delta\theta/2)$ at $\Delta\varphi = \pm\pi/2$, assuming that the sensor is calibrated in the low current regime and therefore the error is zero at small $\Delta\varphi$. Hence, at $\Delta\theta = 2°$, the error in S at $\Delta\varphi = \pm\pi/2$ corresponds to about 1.7%. However, the error in the inverse signal (current signal) is substantially larger since, due to the high slope of the arcsine-function of S near S=±1, any uncertainty in the function translates into a correspondingly large error in the sensor output. The effect is illustrated in the next section in context of the fringe contrast.

4.2 Errors Due to Uncertain Fringe Contrast

Figure 5:
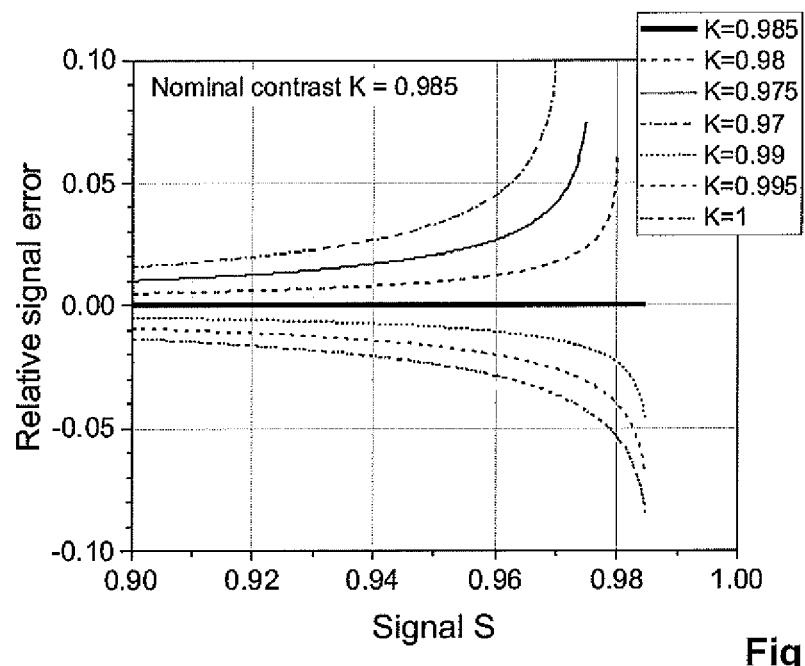
FIG. 5 shows the relative signal error vs. the normalized signal S for various deviations $\Delta K$ from a nominal contrast K=0.985.

Similar errors result from uncertainty in the contrast $K=K_s \cdot K_c$. For illustration, FIGS. 5, 6 show the signal error defined as $E=[\Delta\varphi(K+\Delta K)-\Delta\varphi(K)]/\Delta\varphi(K)$, which occurs if the actual fringe contrast K deviates from its nominal value (here with $K_{nominal}=0.985$) by an amount $\Delta K$.

Figure 6:
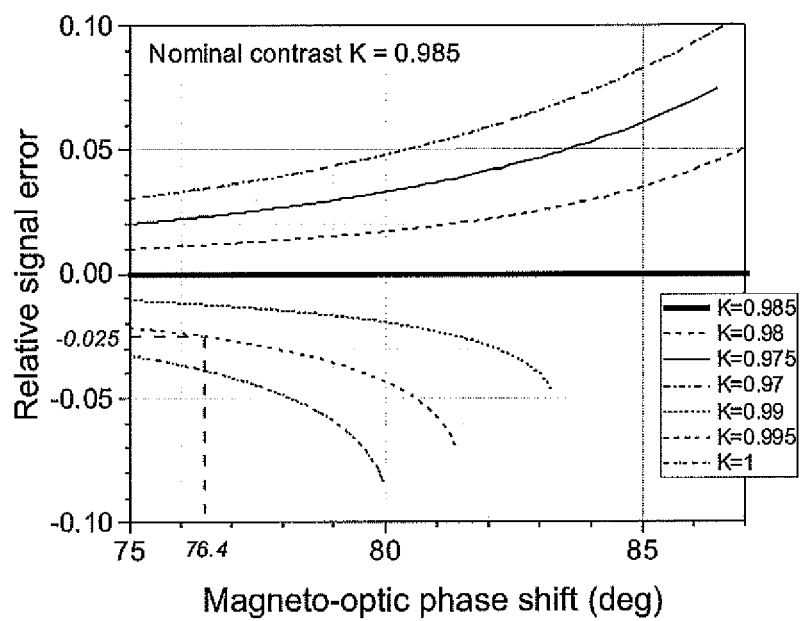
FIG. 6 shows the relative signal error vs. the magneto-optic phase shift $\Delta\varphi$ for various deviations $\Delta K$ from a nominal contrast K=0.985.

For example, if the contrast uncertainty is within $\Delta K = \pm 0.01$ and the maximum allowed signal error is $\pm 2.5\%$, the maximum measurement range corresponds to a magneto-optic phase shift of $\pm 76.4°$, as indicated in FIG. 6 (rather than the theoretical maximum of $\pm 90°$). Likewise, for maximum errors of $\pm 1\%$ and $\pm 5\%$ the corresponding ranges are $\pm 65.4°$, $\pm 80.6°$, respectively.

4.3 Calibration Procedures

As a matter of principle, the above errors can be taken into account by a two-dimensional calibration of the sensor, i.e. a calibration over the entire $\pm\pi/2$-range of magneto-optic phase shifts and the full range of operating temperatures, for example from −40 to 85° C. However, such a calibration would represent a substantial extra effort and complication. Also, currents as high as 100 kA and beyond may be required in some cases.

Here, we disclose a calibration and signal processing procedure that reduces the calibration effort to a minimum and still gives high signal accuracy at high magneto-optic phase shifts (phase shifts approaching ±π/2).

The calibration procedure advantageously comprises the following steps:

A) The low current AC scale factor A' and the DC offset $S_o$ of the signal S are measured as a function of temperature (common temperature of polarization splitter and fiber coil). An inverse $T(S_o)$ of the function $S_o(T)$ is determined such that signal processing enables extraction of the splitter temperature T. The extracted temperature is used to compensate any residual temperature dependence of the sensor (Ref. 4). The two functions A'(T) and $T(S_o)$ can be represented by polynomials or the like, such as a spline-function or look-up table. In this context, it is preferred to work with a first-order retarder (and not a zero-order retarder). A first order retarder triples the slope of $S_o=S_o(T)$ and hence the accuracy of the extracted temperature.

Besides for temperature compensation, the DC offset $S_o(T)$ is also useful for correct linearization of the sensor output as expressed by Eq. (23).

Note: Alternatively, A' (and other parameters such as K) can be represented as function $A'(S_o(T))$, i.e. the compensation of the temperature dependence of A' (and other parameters if desired) is done more directly via $S_o(T)$.

B) The splitters are pre-characterized separately. This characterization gives the phase bias offsets of the two detector channels, $\theta_1(T)$ and $\theta_2(T)$, and the splitter contrast $K_s(T)$ as a function of splitter temperature. Preferably, the phase offsets versus temperature are represented by a first-order polynomial or stored in a look-up table. In general, the contrast $K_s$ can be represented as a temperature-independent parameter.

For characterization, the splitter is attached to an accordingly prepared test fiber coil. Preferably, the coil has a fringe contrast $K_c$ close to unity. A high contrast can be achieved by a sensing fiber with small or negligible bend-induced birefringence (large loop diameter) and a perfect 90°-fiber retarder. Alternatively, the actual contrast can be measured in an independent experiment. The test coil remains at room temperature and generates alternating magneto-optic phases shifts, e.g. at a frequency of 10 Hz, of amplitude somewhat larger than ±π/2. The required current can be kept reasonably small by an adequate number of cable windings. The phase offsets $\theta_1$, $\theta_2$ can be extracted in a straightforward manner from the two detected signals, Eq. (9) and (10). The contrast K is calculated from the individual channel contrast terms $K_i$ as described further above; i=1, 2. The $K_i$-terms are given as $K_i=(S_{i,max}-S_{i,min})/(S_{i,max}-S_{i,min})$ where $S_{i,max}$ and $S_{i,min}$ are the signal maxima and minima (after subtraction of electronics offsets, if any). The splitter contrast is then given as $K_s(T)=K(T)/K_c$.

As alternatives to a test fiber coil, other means such as electro-optic or piezo-electric modulators may be used to generate the phase modulation.

4.4 Signal Computation Adapted for Error Correction 4.4.1 Non-Zero Phase Offset Difference Δθ

As noted above, at a non-zero phase offset difference Δθ, the sum of the signals $S_1$, $S_2$ becomes a function of current, i.e. Δφ (see Eq. 12), which causes current-dependent distortions of the (ideally sinusoidal) sensor response S (described by the parameter k in Eq. (13)). In case of alternating and transient magneto-optic phase shifts Δφ (such as caused by fault currents), such distortions are avoided, if S is calculated from the two (power-normalized) detector signals $S_1$, $S_2$ according to $$S=(S_1-S_2)/C \quad (25)$$

Here, the normalization value C is calculated from previous values $S_1'$, $S_2'$ of the sensor signals $S_1$, $S_2$, at small currents (|Δφ|<<1, in particular at |Δφ|<0.1 rad), i.e. near zero crossings of the measurand.

Advantageously, $C=S_1'+S_2'$.

In this case, C corresponds to the vertices of the parabolas depicted in FIG. 3 and is given by:

$$C=Y_o[1+K\cdot\cos\theta\cdot\sin(\Delta\theta/2)] \quad (26)$$

Hence, the parameter k of Eq. (14) becomes $k=k_o$:

$$k_o=1/[1+K\cdot\cos\theta\cdot\sin(\Delta\theta/2)] \quad (27)$$

Eq. (23) is thus replaced by $$I = \frac{\cos(S_0)}{A'}k_0 K\cos[\Delta\theta/2]\arcsin\left[\frac{S}{k_0 K\cos(\Delta\theta/2)}\right] - \frac{S_0}{A'}\cos(S_0) \quad (28)$$

wherein now, in the scale factor A', the term k is also replaced by $k_o$:

$$A'(T)=k_o\cdot K\cdot R\cdot\cos(\Delta\theta/2)\cdot\cos\theta \quad (29)$$

In more general terms the measurand Z is computed according to $$Z = \frac{1}{A}f(\theta_1,\theta_2,K_1,K_2)\arcsin\left[\frac{S}{f(\theta_1,\theta_2,K_1,K_2)}\right]+H \quad (30)$$

with

A being a scale factor;

f being a function of at least one of the parameters $\theta_1$, $\theta_2$, $K_1$, $K_2$; and H is an offset value, in particular a value of Z near zero-crossings of said measurand, and in particular wherein $$f(\theta_1,\theta_2,K_1,K_2)=k_o\, K\,\cos[\Delta\theta/2], \quad (31)$$

with $$k_o=1/[1+K\cdot\cos(\theta)\cdot\sin(\Delta\theta/2], \quad (32)$$

K being an effective fringe contrast of S, $\theta=(\theta_1+\theta_2)/2$, $\Delta\theta=\theta_1-\theta_2$, and with the offset value H given as $$H=-S_o/A \quad (33)$$

with $S_0$ being a signal offset at a zero value Z, and wherein said scale factor A is given as $$A=A'/\cos\theta \quad (34)$$

with A' being a scale factor determined by calibration as a function of the sensing device temperature T in a regime of |Δφ|<<π/2, in particular |Δφ|<<0.1.

There are several possibilities to extract C from previous values $S_1'$, $S_2'$. The following Procedures 1 and 2 correspond to the first class of embodiments as outlined above, while procedure 3 corresponds to the second class of embodiments.

Procedure 1

Commonly the normal operating regime of the sensor corresponds to |Δφ|<<1, where the current-dependent distortions do not occur. In case of transient fault currents with large Δφ, the sum $S_1+S_2$ is no longer updated with the instantaneous values, but the signal processor continues to use earlier small-current value of $S_1'+S_2'$ as long as |Δφ| is above a preset threshold, e.g. above 0.1 rad. To this end, the low current value of $S_1+S_2$ is continuously stored as a moving average as long as $|\Delta\varphi|$ is below the preset threshold (or the last sample of $C=S_1'+S_2'$ is used that was recorded before $\Delta\varphi$ passed the threshold).

Procedure 2

During each cycle, or at least during some of the cycles, of an AC measurand value, the signal processor determines the vertex of the parabola that represent $S_1+S_2$, i.e. by determining the extremum of the sum $S_1'+S_2'$. (The sum $S_1'+S_2'$ passes the vertex twice within a full cycle). The value of $C=S_1'+S_2'$ may be updated for each half cycle of the measurand or the value of C may be recorded as a moving average over a preset time period, i.e. averaged over more than one half cycle. The normalization works not only for the large $|\Delta\varphi|$ of transient nature, but for any alternating $\Delta\varphi$ independent of its amplitude (preferred procedure).

Procedure 3

A further alternative is an iterative procedure in iterations n with $n=0, \ldots, N-1$: In a first step (n=0), a first estimate I(0) of the current I and thus a first estimate $\Delta\varphi(0)=I(0)\cdot R$ of the magneto-optic phase shift are determined according to Eq. (28), i.e. with $k=k_0$, and by using a first value S(0) of signal S computed from the current-dependent sum, i.e. $S_1+S_2$, i.e. $S(0)=(S_1-S_2)/(S_1+S_2)$.

Then, using the first estimate $\Delta\varphi(0)$, a first estimate k(0) of the parameter k is computed according to Eq. (14). Now, a second value S(1) is then recalculated by multiplying the first value S(0) of S with the ratio $k_0/k(0)$, i.e. $S(1)=S(0)\cdot k_0/k(0)$ with $k_0$ calculated according to Eq. (27). The second step can be repeated several times to increase the accuracy. Finally, the current I (or more generally the measurand value Z) is recalculated according to Eq. (28) using the last recalculated signal value S(N−1) and corresponding offset $S_0(N-1)$ with N−1 being the final iteration number.

In more general terms, the value C to be used in Eq. (25) is calculated in an iterative approach in N iterations, with $n=0, \ldots, N-1$:

C is derived from C(n), with C (n) being a function of $\Delta\varphi(n)$. $\Delta\varphi(n)$ is an iterative value for the phase shift $\Delta\varphi$, and $\Delta\varphi(n+1)$ is calculated from C(n), in particular by calculating iterative values S(n) for S and Z(n) for (Z) from C(n).

In particular, $C(n)=(S1+S2)\cdot k_0/k(n)$ with $k_0=1/[1+K\cdot\cos(\theta)\cdot\sin(\Delta\theta/2)]$ and $k(n)=1/[1+K\cdot\cos\{\theta+\Delta\varphi(n)\}\cdot\sin(\Delta\theta/2)]$. K is the effective fringe contrast, $\theta=\theta_1-\theta_2$, and $\theta=(\theta_1+\theta_2)/2$.

The number of iterations N is advantageously at least one or more.

At the end of the iteration process, the current I (or measurand Z) can be calculated according to Eq. (28), (30).

4.4.2 Nonlinearity in R

If desired, S can be further corrected for the mentioned non-linearity between the magneto-optic phase shift $\Delta\varphi$ and current I, i.e. for the current dependence of R. To this purpose, R(I) is either computed by means of a theoretical model or determined experimentally for a given coil type in an independent experiment. The current I obtained from Eq. (30) is then recalculated according to $$I''=g(I)\cdot I \quad (35)$$

wherein g(I) is a normalized correction function:

$$g(I)=R_o/R(I) \quad (36)$$

Here, $R_o$ is the value of R at $|\Delta\varphi|\ll 1$.

4.4.3 Processing

Figure 7:
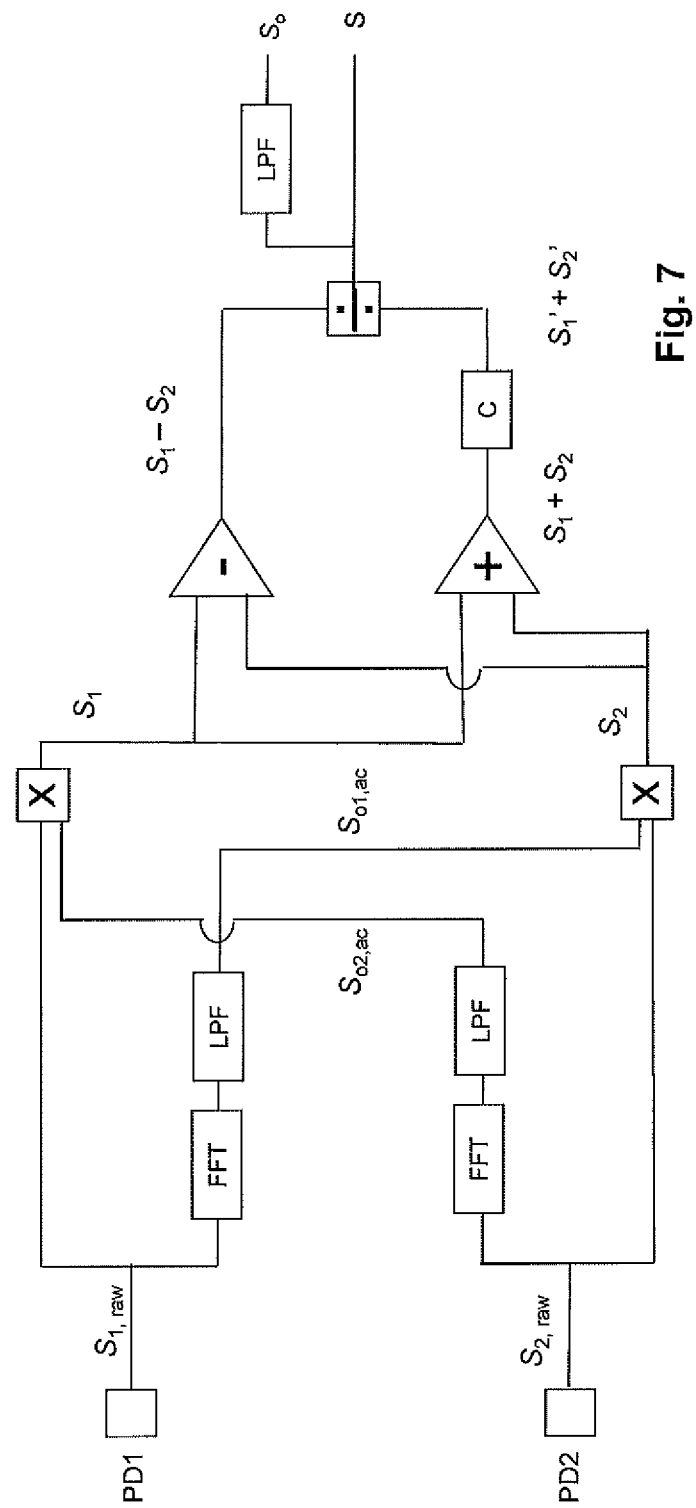
FIG. 7 is a block diagram representing the computation of S and $S_o$ from photo-detector raw signals $S_{1,raw}$, $S_{2,raw}$. PD=photodiode, FFT=fast Fourier transform, LPF=low pass filter, C=module for computation of normalization value C.

The block diagram of FIG. 7 schematically shows how the signal S and DC offset $S_o$ are determined from the two photo-detector signals $S_{1,raw}$, $S_{2,raw}$. The signals $S_{o1,ac}=(S_{o1}/2)$ K·cos $\theta_1$ and $S_{o2,ac}=(S_{o2}/2)\cdot K \cos \theta_2$ are the filtered AC components of the two channels, and they are used to equalize the two detector channels to equal power. (The diagram only shows the basic concept and leaves out, e.g., amplification and digitalization of the detected signals).

In the embodiment shown, $S_{o1,ac}$ and $S_{o2,ac}$ are filtered out by means of a fast Fourier transform of the detector signals (FFT) with subsequent low pass filtering (LPF) for time-averaging with a time-constant much larger than the cycle time of the current or measurand (Ref. 4). Various alternative filtering methods may be applied also, e.g. via signal demodulation or bandpass filtering.

The rescaled signals $S_1$, $S_2$ are added and further processed according to one of the procedures 1-3 described above for generating C, preferably with $C=S_1'+S_2'$. Further, they are subtracted for generating $S_1-S_2$. A divider is used for calculating $S=(S_1-S_2)/C$.

A low-pass filter LPF with a time-constant typically much larger than the cycle time of the current or measurand is applied to S for calculating $S_o$.

4.4.4 Fringe Contrast K

The splitter contrast terms $K_{i,s}$ in the term $K=K_{i,s}\cdot K_c$ are taken as unity, or their value is determined experimentally as explained further above (by means of a test coil).

The temperature dependence of K is given by $K_c=K_\delta(T)$ cos $[\varepsilon'(T)]$ and possibly a contribution $K_s(T)$. For a given coil type (coil diameter, number of fiber loops, retarder orientation and retardation), $K_c$ is measured once as a function of temperature. The procedure is the same as for measuring the splitter contrast $K_s$ and phase offsets $\theta_1$, $\theta_2$ with the difference that the coil is temperature-cycled, whereas the splitter is kept at constant temperature.

Alternatively, $K_c(T)$ may be simply calculated from the retarder and coil parameters and their temperature coefficients.

Again, $K_{i,s}(T)$ and $K_c(T)$ may be described by polynomials, spline functions, or stored in look-up tables.

The signal processor extracts the temperature from the measured value of $S_o$ according to the known temperature dependence $S_o(T)$.

K can then be determined according to the stored temperature dependence K(T); alternatively, K is represented as a function of $S_o$ and is accordingly determined from the measurement of $S_o$.

Alternatively, the complete term K(T), or equivalently $K(S_o)$, may be calibrated for each completed sensor (but this is less preferred since a large number of current windings must be applied to each individual sensor rather than just once to a permanently configured test coil).

In case of a low-birefringent sensing fiber with a retarder deviation from 90°-retardation and/or non-negligible bend-induced birefringence, the relationship between the current and magneto-optic phase shift is slightly nonlinear as noted further above. This is also true for spun highly birefringent sensing fiber. This effect also gives rise to deviation of the signal-vs-current from a perfectly sinusoidal relationship. This can be taken into account by calibrating the current dependence of the parameter R in an independent measurement and correcting the final current signal accordingly (see above).

5. Further Remarks

Instead of glass-based waveguide devices, integrated optic splitters based on other materials such as for example Si, SiN, SiP, or InP may be used.

The sensor of FIG. 1 is implemented with an integrated-optic splitter chip. It should be noted, that all inventive features of the disclosure also apply to polarimetric current sensors of this kind that use bulk-optic beam splitters or polarimetric sensors that introduce the phase bias not by a quarter-wave retarder but by a Faraday rotator (Ref. 6). At bulk-optic beam splitters, phase shifts that occur at the splitter(s) may contribute to the phase offsets $\theta_1$, $\theta_2$. Similarly, deviations of a Faraday rotator from perfect 45°-rotation also cause phase offsets of this kind.

It should further be noted that the invention also applies to other types of sensing fibers, in particular spun highly birefringent sensing fibers (Ref. 4). In that case, the parameters of the spun fiber determine the fringe contrast $K_c$.

Furthermore, instead of a fiber a bulk magneto-optic transducer, e.g. of glass or of another magneto-optic material such as an iron garnet, may be used as a sensing element.

In FIG. 1, the sensing fiber coil is operated in reflective mode. However, the invention may also be applied to coils or bulk magneto-optic materials operated in transmission.

Furthermore, the invention may not only be applied to polarimetric current and magnetic field sensors, but also to other types of polarimetric sensors, in particular electric field sensors based on the Pockels effect in an electro-optic crystal (Ref. 11). In this case, the value Z of the measurand is a value other than the current I. For example, the measurand can be a voltage to be measured, in which case the sensing element is a Pockels-type device placed in the electrical field of the voltage.

In particular, any of the above is also valid for a voltage or electric field sensor using the Pockels effect, if the Verdet-constant is replaced by a suitable electro-optic coefficient and the current by the electrical field.

In other words and in complete generality, the "current" I mentioned herein can be any measurand value Z that can be detected with the sensing element. Hence, in all equations disclosed herein, I can be replaced by Z (and I" by Z").

Typically, the unambiguous measurement range of a polarimetric sensor is limited to phase shifts $\Delta\varphi$ of ±90°. It should be noted, however, that depending on the allowed error, the usable measurement range can be extended beyond ±90°. For example, if the allowed error at high phase shifts, e.g. for fault current measurement, corresponds to 10%, the actual measurement range can be extended to about 116° (where the sine-function again reaches a value of 0.9). It can be advantageous to set the value Z at high phase shifts $\Delta\varphi$, above phase shifts corresponding to 80°, 85°, or 90°, to a constant value, e.g. a value corresponding to a phase shift of 85°.

While there are shown and described presently preferred embodiments of the invention, it is to be distinctly understood that the invention is not limited thereto, but may be otherwise variously embodied and practiced within the scope of the following claims.

REFERENCES CITED

1. K. Bohnert, P. Gabus, J. Nehring, and H. Brandle, "Temperature and vibration insensitive fiber-optic current sensor," Journal of Lightwave Technology, Vol. 20, pp. 267-276, 2002.
2. "The fiber-optic gyroscope", Herve Lefevre, Artech House, Boston, London, 1993.
3. K. Bohnert, A. Frank, H. Brandle, "Fiber-optic current sensor with polarimetric detection scheme", WO2007/121592A1.
4. K. Bohnert, A. Frank, G. Müller, L. Yang, "Optical Sensor", WO2015/090448.
5. K. Kurosawa et al., "Polarization properties of flint glass fiber", J. Lightwave Technology 13, 1378, 1995.
6. R. Kondo, K. Kurosawa, "Optical fiber electric current sensor e.g. reflection type optical fiber electric current sensor, has signal processing unit that converts separated polarized components into signals by photoelectric conversion", WO2011/125564A1.
7. Standard of the International Electrotechnical Commission (IEC), IEC60044-8, Instrument transformers—Part 8: Electronic current transformers.
8. K. Forrest et al., "Channel waveguides in glass via silver-sodium field assisted ion exchange", J. Lightwave Technology LT-4 (2), 140, 1986.
9. WO2014/006121 A1
10. R. C. Jones, "A new calculus for the treatment of optical systems. I. Description and discussion of the calculus", J. Opt. Soc. Am., vol. 31, pp. 488-493, 1941.
11. K. Kurosawa et al., "Development of an optical instrument transformer for DC voltage measurement", IEEE Transactions on Power Delivery, Vol. 8, 1771, 1993.
12. K. Bohnert, P. Gabus, J. Nehring, H. Brandle, M. Brunzel, "Fiber-optic current sensor for electrowinning of metals", J. Lightwave Technology 25, 3602, 2007.
13. J. Hafner, B. Jacobson, "Proactive HVDC breakers—A key innovation for hybrid HVDC grids", Proceedings of Cigre International Symposium on "The electric power system of the future—Integrating supergrids and microgrids", pp 264-271, Bologna, Italy, 13-15 Sep. 2011.

LIST OF REFERENCE NUMBERS AND LETTERS

1: light source
2: beam splitter
3: polarization-maintaining fiber
4: fiber-optic quarter-wave retarder
5: sensing element (sensing fiber)
6: current conductor
7: reflector
8a, 8b: detection channels
9: signal processing unit
D1-D3: Downstream terminals
LPF: Low-pass filter
P1, P2: polarizers
PD1, PD2: photodetectors
QWR: quarter-wave retarder
SMF1, SMF2, SMF3: single-mode fibers
U1: Upstream terminal

The invention claimed is:

1. A method for measuring a value Z of an alternating measurand by means of a sensing device, said method comprising:

sending two different polarization states of a light beam through a sensing element, where the two different polarization states experience a measurand-dependent differential phase shift $\Delta\varphi$, splitting light having passed at least once through said sensing element into at least two channels and carrying out different polarimetric measurements in the two channels, thereby generating two raw signals $S_{1,raw}$, $S_{2,raw}$ depending on the phase shift $\Delta\varphi$ as follows $$S_{1,raw}=(S_{o1}/2)\cdot[1+K_1\sin(\Delta\varphi+\theta_1)],$$

$$S_{2,raw}=(S_{o2}/2)\cdot[1+K_2\sin(\Delta\varphi+\theta_2)],$$

wherein $S_{o1}$, $S_{o2}$ are parameters depending at least on a light source power and optical losses in the sensing device, $K_1$, $K_2$ are parameters of the sensing device,
$\theta_1$, $\theta_2$ are parameters depending at least on the sensing device and having absolute values much smaller than $\pi/2$,
normalizing the two raw signals $S_{1,raw}$, $S_{2,raw}$ to two sensor signals $S_1$, $S_2$ of equal amplitudes $Y_o/2$ $$S_1 = (Y_o/2) \cdot [1 + K_1 \sin(\Delta\varphi + \theta_1)],$$

$$S_2 = (Y_o/2) \cdot [1 + K_2 \sin(\Delta\varphi + \theta_2)],$$

calculating a normalized combined signal S using a normalization value C as $$S = (S_1 - S_2)/C$$

wherein the normalization value C is calculated from previous values $S_1'$, $S_2'$ of the sensor signals $S_1$, $S_2$, near zero crossings of the alternating measurand, by $C = S_1' + S_2'$, or wherein C is calculated in an iterative approach, further calculating said value Z using an arcsine function, using $$K_1, K_2, \theta_1, \text{ and/or } \theta_2.$$

2. The method of claim 1, wherein $\theta_1 \neq 0$, $\theta_2 \neq 0$, $\theta_1 - \theta_2 \neq 0$, $K_1 \neq 1$, and/or $K_2 \neq 1$ at at least one temperature in an operating temperature range of the sensing device and/or wherein the absolute phase shift $|\Delta\varphi|$ reaches values larger than 0.1 rad, larger than 0.5 rad, and larger than 1 rad.

3. The method of claim 1, wherein the correction value C is given by a sum of $S_1'$ and $S_2'$ with $S_1'$, $S_2'$ being the previous values of $S_1$, $S_2$ corresponding to phase shifts $\Delta\varphi$ having absolute values smaller than a threshold, the threshold being below 0.1 rad.

4. The method of claim 3 wherein $S_1'$ and $S_2'$ are determined as time-averaged values of $S_1'$ and $S_2'$ during time periods where $|\Delta\varphi|$ is below said threshold and over at least one half-cycle of the alternating measurand.

5. The method of claim 3 wherein, for determining said normalization value C, an extremum of a sum of $S_1 + S_2$ within at least one half-cycle of the alternating measurand is determined by averaging the obtained extrema over more than one half-cycle.

6. The method of claim 1, wherein the normalization value C is calculated in an iterative approach, wherein in an iteration n with $n = 0, \ldots, N-1$:
C is derived from C(n), with C(n) being a function of $\Delta\varphi(n)$, wherein $\Delta\varphi(n)$ is an iterative value for the phase shift $\Delta\varphi$, and $\Delta\varphi(n+1)$ is calculated from C(n) by calculating iterative values S(n) for S and Z(n) for Z from C(n).

7. The method of claim 6 wherein $C(n) = (S_1 + S_2) \cdot k_0 / k(n)$ with $k_0 = 1/[1 + k \cdot \cos(\theta) \cdot \sin(\Delta\theta/2)]$ and $k(n) = 1/[1 + K \cdot \cos(\theta + \Delta\varphi(n) \cdot \sin(\Delta\theta/2)]$, with K being an effective fringe contrast and $\theta = (\theta_1 + \theta_2)/2$ and $\Delta\theta = \theta_1 - \theta_2$.

8. The method of claim 7, wherein
N=1 or larger, and in a first iteration $\Delta\varphi(0)$ is set to a starting value comprising zero.

9. The method of claim 8, wherein the value Z is calculated as $$Z = \frac{1}{A} f(\theta_1 \theta_2, K_1, K_2) \arcsin\left[\frac{1}{f(\theta_1 \theta_2, K_1, K_2)}\right] + H$$

with
A being a scale factor;
f being a function of at least one of the parameters $\theta_1 \theta_2$, $K_1$, $K_2$; and H is an offset value comprising a value of Z near zero-crossings of said measurand.

10. The method of claim 9, wherein the value Z is calculated with $f(\theta_1 \theta_2, K_1, K_2) = koK\cos[\Delta\theta/2]$, with $$ko = 1/[1 + K \cdot \cos(\theta + \Delta\varphi(n) \cdot \sin(\Delta\theta/2)]$$

K being an effective fringe contrast of S, $\theta = (\theta_1 + \theta_2)/2$, $\Delta\theta = \theta_1 - \theta_2$;
and wherein the offset value H is given as $$h = -So/A$$

with So being a signal offset at a zero value Z, and said scale factor A is given as $$A = A'/\cos\theta$$

with A' being a scale factor determined by calibration in a regime of shift $|\Delta\varphi| \ll \pi/2$, including $|\Delta\varphi| \ll 0.1$, and A' being obtained from calibration data as a function of a temperature (T) of at least part of said sensing device.

11. The method of claim 9, wherein said parameters $\theta_1$, $\theta_2$, $\theta = (\theta_1 + \theta_2)/2$, $\Delta\theta = \theta_1 - \theta_2$, $K_1$ and/or $K_2$, or parameters dependent on at least one of them, are calculated from calibration data as a function of a temperature of at least part of said sensing device or of a value indicative of the temperature of at least part of said sensing device.

12. The method of claim 11 wherein said parameters $K_1$ and $K_2$ are assumed to be 1 or are calculated from further parameters of the sensing device.

13. The method of claim 1 wherein, for normalizing the raw signals $S_{1,raw}$, $S_{2,raw}$, time-averaged amplitudes $S_{o1,ac}$, and $S_{o2,ac}$ at an alternating frequency of said measurand are calculated and said signals $S_1$, $S_2$ are calculated as $$S_1 = S_{1,raw} \cdot S_{o2,ac}$$

$$S_2 = S_{2,raw} \cdot S_{o1,ac}.$$

14. A sensing device for measuring a value Z of an alternating measurand, the sensing device comprising:
a beam-splitter comprising an integrated-optic beam splitter connecting at least three downstream terminals to at least one upstream terminal,
a light source connected to a first downstream terminal of the at least three downstream terminals,
a first polarizer and a first light detector arranged to measure a first raw signal $S_{1,raw}$ from light returning from a sensing element at a second downstream terminal of the at least three downstream terminals, and
a second polarizer and a second light detector arranged to measure a second raw signal $S_{2,raw}$ from light returning from said sensing element at a third downstream terminal,
wherein said first polarizer and said second polarizer are orthogonally polarized, and
wherein said upstream terminal is connected to said sensing element; and
a signal processing unit, wherein during operation, the signal processing unit causes the sensing device to perform operations comprising:
sending two different polarization states of a light beam through the sensing element, where the two different polarization states experience a measurand-dependent differential phase shift $\Delta\varphi$,
splitting light having passed at least once through said sensing element into at least two channels and carrying out different polarimetric measurements in the two channels, thereby generating two raw signals $S_{1,raw}$, $S_{2,raw}$ depending on the phase shift $\Delta\varphi$ as follows $$S_{1,raw}=(S_{o1}/2)\cdot[1+K_1\sin(\Delta\varphi+\theta_1)],$$

$$S_{2,raw}=(S_{o2}/2)\cdot[1+K_2\sin(\Delta\varphi+\theta_2)],$$

wherein
- $S_{o1}$, $S_{o2}$ are parameters depending at least on a light source power and optical losses in the sensing device,
- $K_1$, $K_2$ are parameters of the sensing device,
- $\theta_1$, $\theta_2$ are parameters depending at least on the sensing device and having absolute values much smaller than $\pi/2$, normalizing the two raw signals $S_{1,raw}$, $S_{2,raw}$ to two sensor signals $S_1$, $S_2$ of equal amplitudes $Y_{o2}/2$ $$S_1=(Y_o/2)\cdot[1+K_1\sin(\Delta\varphi+\theta_1)],$$

$$S_2=(Y_o/2)\cdot[1+K_2\sin(\Delta\varphi+\theta_2)],$$

calculating a normalized combined signal S using a normalization value C as $$S=(S_1-S_2)/C$$

wherein the normalization value C is calculated from previous values $S_1'$, $S_2'$ of the sensor signals $S_1$, $S_2$, near zero crossings of the alternating measurand, by $C=S_1'+S_2'$, or wherein C is calculated in an iterative approach, further calculating said value Z using an arcsine function, using $K_1$, $K_2$, $\theta_1$, and/or $\theta_2$.

15. The sensing device of claim 14, wherein a quarter-wave retarder is arranged either between said first polarizer and said first downstream terminal or between said first polarizer and second polarizer and said second and third downstream terminals.

16. The sensing device of claim 15, wherein during operation, the signal processing unit causes the sensing device to perform further operations comprising
measuring a temperature (T) of said beam-splitter, and
calculating said parameters $K_1$, $K_2$, $\theta_1$, and/or $\theta_2$ as a function of said temperature (T) using calibration data obtained in calibration measurements on said beam-splitter, wherein said calibration data describe a temperature dependence of said parameters,
and wherein a temperature (T) of said beam-splitter, is determined from an accordingly calibrated signal-offset So at Z=0 or by means of a temperature sensor.

17. The sensing device of claim 16, wherein during operation, the signal processing unit causes the sensing device to perform further operations comprising:

calculating a refined value Z" of the value Z of the measurand Z from $$Z''=g(z)\cdot Z,$$

wherein g(z) is a normalized correction function.

18. The sensing device of claim 14 wherein said alternating measurand is an electrical current in a conductor and said sensing element is a fiber wound at least once around said conductor, or
wherein the alternating measurand is an electrical field or voltage, and the sensing element is an element exhibiting an electro-optic Pockels effect and is placed in said field or in a field proportional to the voltage.

19. The sensing device of claim 18, wherein during operation, the signal processing unit causes the sensing device to perform further operations comprising calculating the value Z as $$Z=\frac{1}{A}f(\theta_1\theta_2,K_1,K_2)\arcsin\left[\frac{1}{f(\theta_1\theta_2,K_1,K_2)}\right]+H$$

with
A being a scale factor;
f being a function of at least one of the parameters $\theta_1$, $\theta_2$, $K_1$, $K_2$; and
H is an offset value comprising a value of Z near zero-crossings of said measurand.

20. The sensing device of claim 19, wherein during operation, the signal processing unit causes the sensing device to perform further operations comprising calculating the value Z with $f(\theta_1\theta_2,K_1,K_2)=koK\cos[\Delta\theta/2]$, with $$ko=1/[1+K\cdot\cos(\theta+\Delta\varphi(n)\cdot\sin(\Delta\theta/2)]$$

K being an effective fringe contrast of S, $0=(\theta_1+\theta_2)/2$, $\Delta\theta=\theta_1-\theta_2$;
and wherein the offset value H is given as $$h=-So/A$$

with So being a signal offset at a zero value Z, and said scale factor A is given as $$A=A'/\cos\theta$$

with A' being a scale factor determined by calibration in a regime of shift $|\Delta\varphi|<<\pi/2$, including $|\Delta\varphi|<<0.1$, and A' being obtained from calibration data as a function of a temperature (T) of at least part of said sensing device.

* * * * *